(12) United States Patent
Ong

(10) Patent No.: US 6,269,723 B1
(45) Date of Patent: *Aug. 7, 2001

(54) METHOD AND APPARATUS FOR ENHANCEMENT OF A PUNCH GUIDE/RECEPTOR TOOL IN A DAMBAR REMOVAL SYSTEM

(75) Inventor: Ee Chang Ong, Cupertino, CA (US)

(73) Assignee: Integrated Packaging Assembly Corporation, San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/954,972

(22) Filed: Oct. 20, 1997

(51) Int. Cl.[7] ............................................. B26F 1/00
(52) U.S. Cl. ..................... 83/687; 83/691; 83/698.71; 83/699.11; 83/954
(58) Field of Search .............. 83/687, 691, 698.71, 83/699.11, 954

(56) References Cited

U.S. PATENT DOCUMENTS

| | | | | |
|---|---|---|---|---|
| 1,302,248 | * | 4/1919 | Vogetzer | 83/691 |
| 3,083,604 | * | 4/1963 | Ferren | 83/687 X |
| 3,229,275 | * | 1/1966 | Taber | 83/687 X |
| 3,319,501 | * | 5/1967 | Risher | 83/698.71 X |
| 3,690,209 | * | 9/1972 | Gargrave et al. | 83/687 X |
| 3,738,402 | * | 6/1973 | Cross | 83/698.71 X |
| 3,848,494 | * | 11/1974 | Gargrave et al. | 83/698.71 X |
| 4,233,873 | * | 11/1980 | Jessen | 83/698.71 X |
| 4,408,522 | * | 10/1983 | Yamane | 100/295 |
| 4,611,484 | * | 9/1986 | MacKissinger, Jr. et al. | 83/698.71 X |
| 4,685,613 | * | 8/1987 | Schambre | 234/131 |
| 4,823,661 | * | 4/1989 | Freres | 83/687 X |
| 4,995,289 | * | 2/1991 | Bakermans | 83/691 X |
| 5,007,282 | * | 4/1991 | Bakermans | 83/691 X |
| 5,146,824 | * | 9/1992 | Lajoie | 83/687 X |
| 5,172,622 | * | 12/1992 | Sabin | 83/698.71 X |
| 5,178,050 | * | 1/1993 | Kazuhiko | 83/687 X |
| 5,178,051 | * | 1/1993 | Smith et al. | 83/687 X |
| 5,231,908 | * | 8/1993 | Skvarce et al. | 83/698.71 X |
| 5,291,814 | * | 3/1994 | Fierkens | 83/691 X |
| 5,452,635 | * | 9/1995 | Ong | 83/691 X |
| 5,495,780 | * | 3/1996 | Ong | 76/101.1 |
| 5,497,681 | * | 3/1996 | Ong | 76/101.1 |

FOREIGN PATENT DOCUMENTS

862748 * 3/1961 (GB) .................................... 83/687

* cited by examiner

*Primary Examiner*—M. Rachuba
(74) *Attorney, Agent, or Firm*—Donald R Boys; Central Coast Patent Agency Inc.

(57) ABSTRACT

A punch guide/receptacle for a dambar-removal tool set has a mounting fixture and an insert adapted to mount to an adaptive region of the mounting fixture. Apertures for punch teeth in the guide/receptacle are a part of the insert. In practicing the invention inserts may be removed and repaired. In one embodiment the insert has an upper and a lower row of apertures, and repair may be accomplished in some instances simply by reversing the insert in the mounting block.

8 Claims, 5 Drawing Sheets

METHOD AND APPARATUS FOR ENHANCEMENT OF A PUNCH GUIDE/RECEPTOR TOOL IN A DAMBAR REMOVAL SYSTEM

FIELD OF THE INVENTION

The present invention is in the area of integrated circuit (IC) manufacturing, and pertains in particular to apparatus and methods for dambar trimming after encapsulation of integrated circuits on leadframes.

BACKGROUND OF THE INVENTION

Integrated circuits (ICs), sometimes termed chips or dies, before ready for use, are typically packaged by encapsulation in a polymer material. The encapsulation process is to protect the individual IC during handling and operation.

In general, plastic encapsulation of ICs to form packaged ICs with electrical leads is as follows: ICs in die form are attached to mounting areas of a lead frame called islands, or die-attach pads. The lead flames are typically made of a thin, flat, metal sheet chosen for a number of characteristics including electrical conductivity. Lead frames typically have multiple, individual die attach pads, each for supporting an individual IC during encapsulation, wherein the individual dies are encapsulated in plastic material, leaving electrical leads protruding from the plastic encapsulation.

In the encapsulation process mating molds are placed against each side of the lead frame and liquid-phase polymer is injected to encapsulate IC dies attached to the die attach pads. The lead frame is designed to dam the flow of liquid-phase polymer as it moves to the outer edges of each individual mold cavity, stopping at the points where each mold contacts surfaces of the lead frame. To stop the flow of liquid-phase polymer between leads the lead frame has a pattern of dambars between individual leads, so that a contiguous band of material is formed around the periphery of the die attach pad. This contiguous band prevents the liquid polymer material from escaping from the mold cavity, and also allows the lead frame to remain one contiguous piece of material until subsequent trimming operations are performed.

After the polymer material solidifies and the molds are removed, a following operation in the manufacturing process removes the excess plastic in the region around the mold outline and also removes the dam bars, separating the leads electrically. The de-damming process removes the dambar portion of the lead frame material between each of the leads, providing electronic integrity for each lead. De-damming is a process of removing all or part of each dambar by use of a punch with a pattern of teeth conforming to the pattern of the dambars in the lead frame.

In a de-damming operation, a lead frame mounting the ICs to be trimmed is fed either manually or in an automated fashion through a punch press operation comprising at least one closable die with tooling for punching out the dambar material desired to be removed. Tooling within the die typically comprises an upper section holding punches having punch teeth arranged in a pattern to engage and remove the dambar portions of the leadframe, an intermediate portion adapted as a punch guide and stripper, and a lower section adapted as a guide for the punch teeth and a receptacle to receive dambar material trimmed and pushed by the punch teeth into the lower tooling area. In operation a lead frame is positioned on the lower tooling portion, the stripper portion closes on the top of the lead frame, and the punches are driven downward with the teeth passing through the lead frame, removing the dambar material, and pushing the removed material into the lower tooling section, where material is typically removed by vacuum apparatus. As teeth retract after a trimming operation, any material adhering to the punch teeth is typically removed (stripped) by the stripper/guide above the lead frame.

There are, as is widely known, many sorts of ICs having varying patterns of leads, and the lead frames used in the manufacturing process conform to the lead patterns of the ICs. There are, therefore, many different patterns of punches and teeth, and arrangement of punches in trimming tooling. These arrangements and variations are not particularly pertinent to the present invention, which may be practiced with essentially any known IC pattern in dambar removal.

There is a problem with conventional dambar removal tools. Apertures for punch teeth both in stripper/guides and in lower guide/receptacles, are subject to chipping and breaking as the punch teeth are repeatedly inserted and withdrawn. Also, continued use can stress or weaken the aperture pattern resulting in a higher probability of resultant breakage. Because these tools are typically fashioned from a single hardened tool blank, a broken tool cannot be easily repaired, and a new unit must be fabricated to replace a broken one. Precision grinding operations used in the fabrication of these tools are time consuming, delicate, and costly.

What is clearly needed is a method and apparatus whereby the delicate portion of the punch guide/receptacle can be replaced without re-manufacturing the entire tool. A method and apparatus such as this would save time and material, and make the maintenance process more manageable.

SUMMARY OF THE INVENTION

In a preferred embodiment of the present invention an integrated punch guide/receptacle for a dambar-removal tool set having a punch with a plurality of teeth in a specific pattern is provided, the guide/receptacle comprising a mounting fixture adapted to mount to a frame of the tool set and having an insert-adaptive region; and an insert having a plurality of apertures in the specific pattern of the punch teeth, for receiving the punch teeth and material removed from dambars by the punch teeth, the insert adapted for mounting to the mounting fixture in the insert-adaptive region. The insert mounts to the mounting block in the insert-adaptive region and the mounting fixture mounts to the tool set.

In some embodiments the insert has an upper row of apertures and a lower row of apertures, such that the insert may be reversed in the insert-adaptive region presenting the lower row of teeth in the position the upper row occupied before reversal. Also in some embodiments the mounting fixture has hold-down regions geometrically adapted for mounting to a conventional dambar-removal tool set. The insert may mount to the mounting fixture in a variety of ways, such as by press fitting or by use of conventional screw fasteners.

In another aspect of the invention a dambar-removal tool set is provided comprising a punch with a plurality of teeth in a specific pattern; a mounting fixture adapted to mount to a frame of the tool set and having an insert-adaptive region; and an insert having a plurality of apertures in the specific pattern of the punch teeth, for receiving the punch teeth and material punched from dambar regions, and adapted for mounting to the mounting fixture in the insert-adaptive region. The insert mounts to the mounting fixture in the insert-adaptive region and the mounting fixture mounts to the tool set.

In some embodiments the receiving die has an upper row of apertures and a lower row of apertures, such that the insert may be reversed in the insert-adaptive region presenting the lower row of teeth in the position the upper row occupied before reversal. Mounting inserts may be accomplished by several methods, such as by press fit and by set screws, and so forth.

In still another aspect of the present invention a method is provided for adapting a conventional punch guide/receptacle for enhanced repairability, the punch guide/receptacle a part of a dambar-removal tool set and having a set of guide apertures, comprising steps of (a) removing the guide apertures and a surrounding region of material from the conventional punch guide/receptacle, creating thereby an insert-receiving region; (b) providing an insert adapted to mount to the insert receiving region, the insert having at least one set of guide apertures in the pattern of the guide apertures removed; and (c) mounting the insert to the receiving region, providing thereby a guide/receptacle wherein the guide apertures may be removed and replaced by replacing the insert.

BRIEF DESCRIPTION OF THE DRAWING FIGURES

DESCRIPTION OF THE PREFERRED EMBODIMENTS

Figure 1:
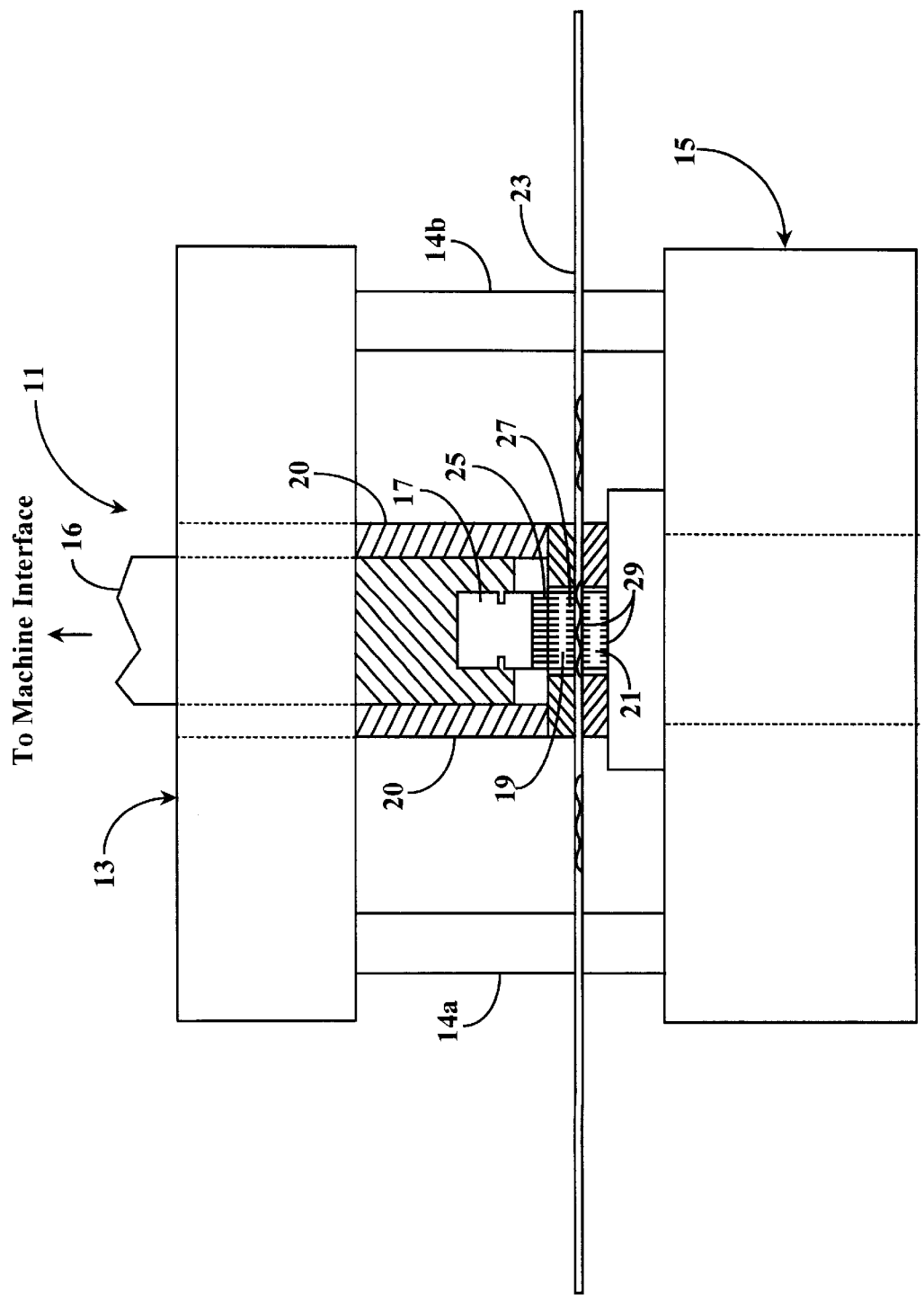
FIG. 1 is a partially-sectioned elevation view of a dambar-removal tool set according to an embodiment of the present invention.

Tool set 11 is a tool-holding and facilitating fixture assembly adapted to be interfaced with a ram 16 of an automated vertically operating punch machine. When tool set 11 is assembled with the proper elements installed, it is mounted to a predetermined location or center position on the foot of a die. Further set-up procedures are required to enable indexing of an inserted lead frame 23 so that attached dies on lead frame 23 can be placed in a position for dambar removal.

In this embodiment, lead frame 23 is inserted from the right or left and is caused to move horizontally (right to left or left to right) via separate mechanical methods (not shown) generic to the punch machine. As well, automation is provided to a portion of base 15 so that it may move upward in accordance with the downward motion of a punch set, of which punch 17 shown is one of the punches in the set, to provide stability to the portion of the lead frame being processed. Such arrangements of tooling and method with respect to various interface schemes to a punch press and associated work-space fixtures are well known in the art and to the inventor.

Punch 17 and an opposite punch of the punch set (not seen in FIG. 1) are installed in this embodiment into a cylindrical ram 16 provided as part of the punch machine. In another embodiment, punch-set 17 may be installed in the top of tool set 11 with an adjoining mounting fixture provided for interfacing to ram 16. Various schemes are possible. In this simplified embodiment, ram 16 is guided inside a cylindrical ram sleeve 20 which mounts into top portion 13. The punch-set in this embodiment comprises two identical punches (one is 17) held parallel to each other in ram 16 for the purpose of punching dambar material on opposite sides of an encapsulated IC on lead frame 23. Punch 17 has a plurality of punch teeth 25 adapted to fit into a like plurality of apertures provided in a guiding and stripping element described further below.

Tool set 11 is a closed fixture, meaning that internal elements installed therein cannot normally be seen. Therefore, the areas that are sectioned in the figure, and contain the elements required for the de-damming process, are shown extended far below top portion 13 for illustrative purposes only. In actual operation, top portion 13 maintains a position very near the surface of lead frame 23.

In conventional art, a punch stripper/guide is provided for guiding and supporting a punch, such as punch 17, and for stripping the punch teeth as the punch is withdrawn. Such a conventional stripper/guide is typically made of one piece of material as briefly described above in the background section. A conventional punch stripper/guide has a usually linear pattern of apertures on it's upper surface for accepting the teeth of the punch. Part of the punch stripper/guide is a hold down region having steps for facilitating a clamping or other hold-down apparatus used to position the guide in the top portion of the tool set, and to hold it in place. A central portion of the punch guide contains the apertures.

In conventional art, a punch guide tool is also provided in the lower portion of the tool set, beneath a lead frame being processed, for guiding and supporting the teeth of the punch after they pass through the lead frame, and for receiving dambar material removed from the lead frame by the punching action. This tool is referred to in this specification as a punch guide/receptacle. A conventional punch guide/receptacle has a single set of apertures arranged linearly on an upper surface in the same pattern as provided in the upper punch guide/stripper. A punch guide/receptacle typically has hold-down regions having stepped shoulders for clamping the receptacle in position. A center portion of the punch guide/receptacle comprises the linear pattern of apertures.

Figure 2:
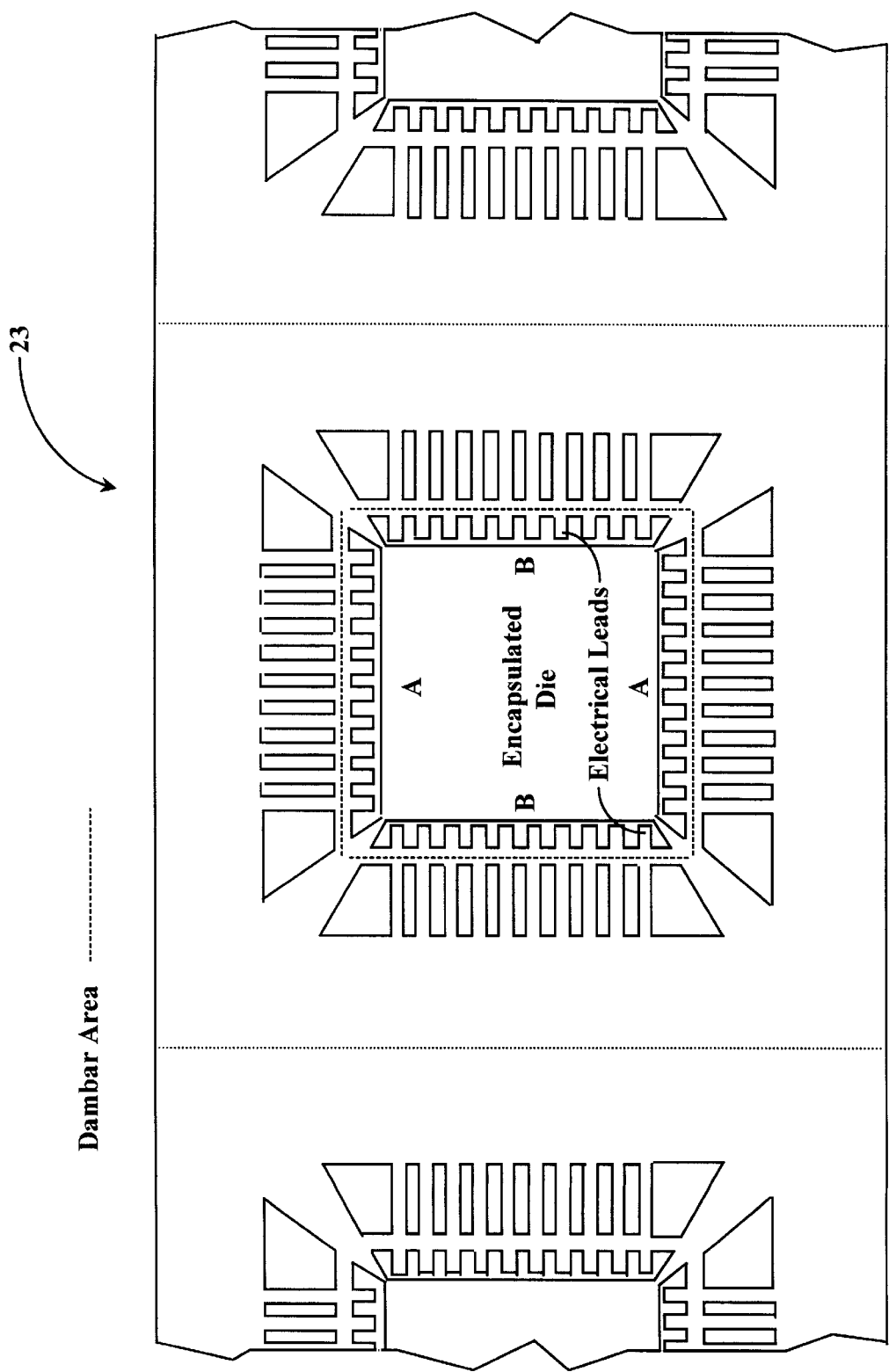
FIG. 2 is a broken view of a standard lead-frame viewed from the top showing dambar area.

FIG. 2 is a plan view of a portion of a standard lead frame 23 (seen in side view in FIG. 1) as known in the art, for mounting and encapsulating ICs having leads projecting from four sides. The encapsulated ICs thus formed are known in the art as Quad Flat Packs (QFP). This arrangement is adequate for describing a preferred embodiment of the present invention. The invention, however, is applicable to many other types of encapsulated ICs with lead arrangements that differ radically from QFPs.

An IC is mounted to each island (die attach pad) of the lead frame of FIG. 2 and wires are bonded from pads on the IC to leads of the lead frame strip around each mounted IC. A dambar is represented by a dotted rectangle in FIG. 2, forming a periphery of contiguous material around an encapsulated die. The portions of the dambar to be removed in the de-damming process are the bridges between each electrical lead.

The dambar area surrounding the encapsulated die between adjacent leads is removed in one embodiment by punching in a sides-opposite and alternate fashion. For example, in this example a punch set comprising two parallel punches is aligned to dambar regions on opposite sides marked A in FIG. 2. As the lead frame moves from one target position to the next, all dambar regions on sides marked A are punched out simultaneously. In another station after the sides A are punched another die with another tool set, having the opposite parallel punches rotated ninety degrees from the position of the punches in the first set punches the dam bar regions on sides marked B.

An alternating system as described is practiced for the purpose of reducing deformation of individual leads which can be caused by an unequal punching force It is emphasized, however, that in circumstances one side at a time may be punched, and in others all four sides may be punched at once. Other arrangements may be used for other types of ICs. The order and geometry of punching is not limiting to the present invention.

Figure 3A:
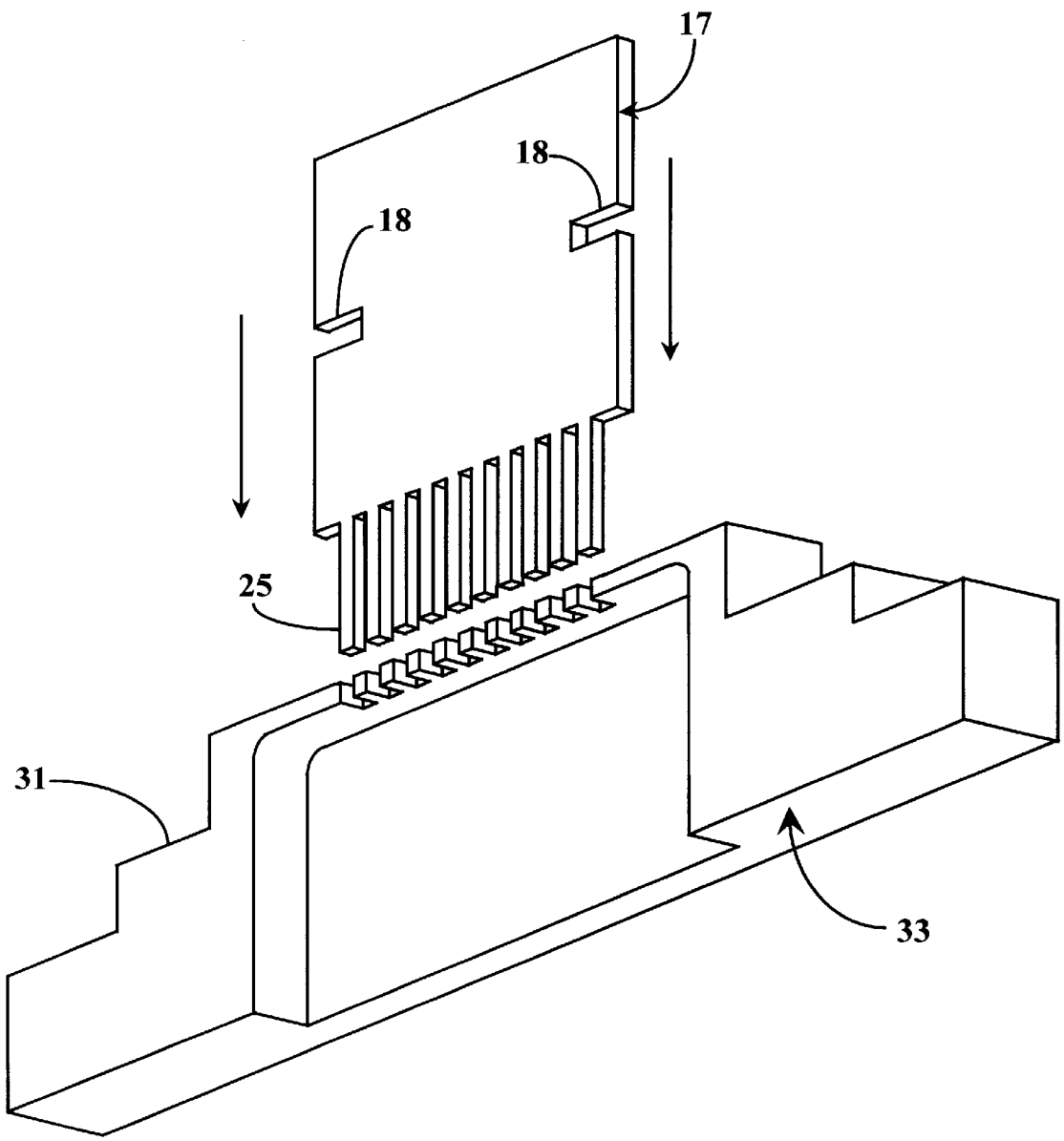
FIG. 3A is an isometric view of a punch guide/receptacle and a punch as known in the prior art.

FIG. 3A is an isometric and magnified view of punch 17 of FIG. I and a conventional punch guide/receptacle 33 as are currently known in the art. Punch 17 is typically formed from a carbide blank principally by grinding, which is a standard method and material for manufacturing such tools. Punch 17 may also be formed from any suitable hardened tool steel known in the art. The material of the punch and guide/receptacle are not limiting to the scope of the present invention. Key slots 18 are provided for mounting punch 17 to fixturing adapted for that purpose, either in ram 16 of FIG. 1, or in upper portion 13 of FIG. 1 as previously described. Punch stripper/guide 19 and punch guide/receptacle 33 of FIG. 1 are conventionally ground as single parts from carbide tool blanks as is punch 17.

Conventional punch guide/receptacle 33 has hold down regions 31 that are adapted for use with a clamping or hold down apparatus. Upon downward motion of punch 17 (illustrated by directional arrows), individual punch teeth 25 pass through the individual apertures in punch stripper/guide 19 (FIG. 1), through lead frame 23, removing dambar material, and then into individual apertures in conventional punch guide/receptacle 33. The mating tolerances that must be held to allow the teeth of punch 17 to pass through the apertures in both the stripper and the receptacle die 33 are small enough to require that precision grinding be used to form teeth 25 and the associated apertures through which the teeth 25 must pass. Also, flatness, parallelism, and other dimensional properties of both punch 17, stripper 19 and receptacle 33 must be held to close tolerance as well.

As described with reference to the background section, precision grinding is time consuming and expensive. A high grade carbide material such as would be preferred in this type of tool making is also expensive.

Figure 3B:
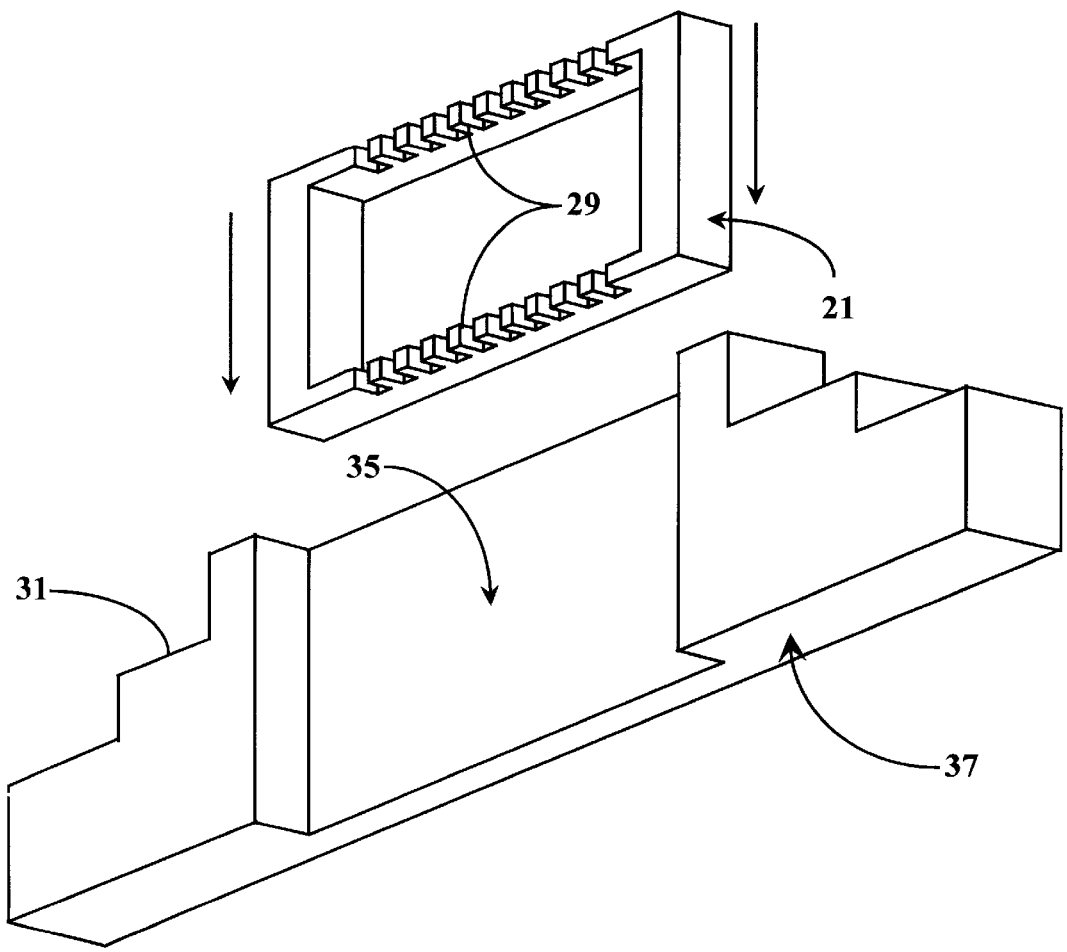
FIG. 3B is an isometric view of an insert and associated mounting fixture according to an embodiment of the present invention.

FIG. 3B is an isometric and enlarged view of guide/receptacle 21 of FIG. 1 and a mounting fixture 37 according to a preferred embodiment of the present invention. Mounting fixture 37 is basically receptacle 33 of FIG. 3A with the aperture region removed creating an insert mounting region 35. Insert 21 may be produced from a carbide tool-blank or any suitable hardened tool-steel known in the art such as described above with reference to other tooling. It will be apparent to one with skill in the art that a mounting block may be provided separately instead of modifying conventional receptacle 33.

There are three distinct advantages created by this innovation. One is that insert 21 can be removed and replaced in the event of breakage or wear. This allows more time to be dedicated to processing and less time required for repair or re-manufacture of new tooling. Furthermore, only the insert is required to be manufactured and not the entire piece. A second advantage, deriving from the fact of two rows 29 of apertures on insert 21 is that die-insert 21 can be removed, reversed and then re-inserted into receiving area 35 so that an unused row of apertures 29 can be presented to punch 17. A further advantage over the conventional method is that die-insert 21 can be ground separately while leaving mounting block 37 in place in tool set 11 of FIG. 1. Existing conventional may be modified to accept inserts such as die-insert 21. As well, new mounting fixtures may be manufactured as required.

Figure 4:
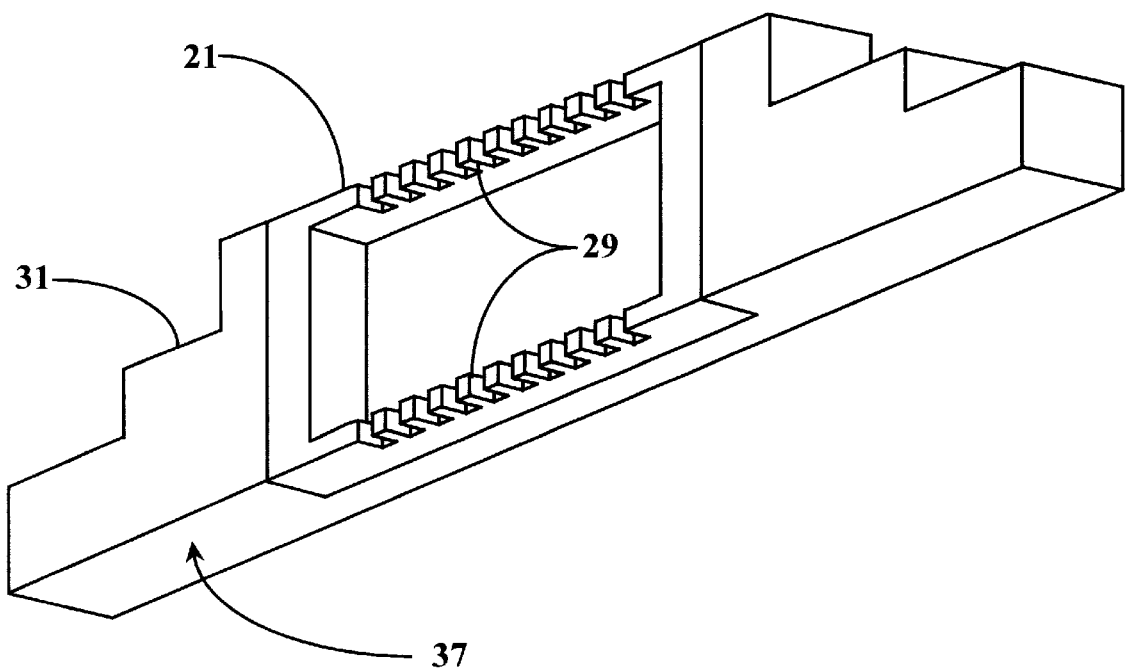
FIG. 4 is an isometric view of a mounting fixture with an insert installed according to an embodiment of the present invention.

FIG. 4 is an isometric and magnified view of insert 21 of FIG. 3b in final position in mounting fixture 37 according to an embodiment of the present invention. A press fit technique is used in this embodiment. There are, however, many other ways to install insert 21 into mounting fixture 37 without departing from the spirit and scope of the present invention. For example, in an alternative embodiment a threaded bore and set screw may be used to lock insert 21 into mounting fixture 37. In another embodiment, keys may be inserted into keyways provided in mounting fixture 37 and in insert 21 thereby locking them into position.

It will be apparent to the skilled artisan that there are many alterations that might be made in the embodiments described above without departing from the spirit and scope of the present invention. For example, there are many types of material that might be used, many variations available for assembling inserts to mounting fixtures, and the like. The invention is also not limited by the number or rows of punch teeth and apertures, or by the spacing of tooling in strippers of various sorts. The scope of the present invention is limited only by the claims that follow.

What is claimed is:

1. An integrated punch guide/receptacle for a dambar-removal tool set having a punch with a plurality of teeth in a specific pattern, the guide/receptacle comprising:

a mounting fixture adapted to mount to a frame of the tool set and having an insert-adaptive region; and an insert having an upper first aperture bar having a first row of apertures in the specific pattern of the punch teeth, and a lower second aperture bar having a second row of apertures also in the specific pattern of the punch teeth for receiving the punch teeth and material removed from dambars by the punch teeth, the insert adapted for mounting to the mounting fixture in the insert-adaptive region;

wherein the insert mounts to the mounting fixture in the insert-adaptive region, the mounting fixture mounts to the tool set, and the insert may be reversed within the insert-adaptive region presenting the lower second bar of apertures in the position the upper first bar of apertures occupied before reversal.

2. The guide/receptacle of claim 1 wherein the mounting fixture has hold-down regions geometrically adapted for mounting to a conventional dambar-removal tool set.

3. The guide/receptacle of claim 1 wherein the insert mounts to the mounting fixture by a press fit.

4. The guide/receptacle of claim 1 wherein the insert mounts to the mounting block by one or more screw fasteners.

5. A dambar-removal tool set comprising:

a punch with a plurality of teeth in a specific pattern;

a mounting fixture adapted to mount to a frame of the tool set and having an insert-adaptive region; and an insert having an upper first aperture bar having apertures in the specific pattern of the punch teeth, and a second lower aperture bar also having apertures in the specific pattern of the punch teeth for receiving and supporting the punch teeth and material punched from dambar regions, and adapted for mounting to the mounting fixture in the insert-adaptive region;

wherein the insert mounts to the mounting fixture in the insert-adaptive region, the mounting fixture mounts to the tool set, and the insert may be reversed within the insert-adaptive region presenting the lower second bar of teeth in the position the upper first bar occupied before reversal.

6. The tool set of claim 5 wherein the mounting fixture has hold-down regions geometrically adapted for mounting to a conventional dambar-removal tool set.

7. The tool set of claim 5 wherein the insert mounts to the mounting fixture by a press fit.

8. The tool set of claim 5 wherein the insert mounts to the mounting fixture by one or more screw fasteners.

* * * * *